United States Patent
Chen

(10) Patent No.: US 9,735,097 B1
(45) Date of Patent: Aug. 15, 2017

(54) PACKAGE SUBSTRATE, METHOD FOR MAKING THE SAME, AND PACKAGE STRUCTURE HAVING THE SAME

(71) Applicant: Qi Ding Technology Qinhuangdao Co., Ltd., Qinhuangdao (CN)

(72) Inventor: Yi-Ho Chen, New Taipei (TW)

(73) Assignee: Qi Ding Technology Qinhuangdao Co., Ltd., Qinhuangdao (CN)

( * ) Notice: Subject to any disclaimer, the term of this patent is extended or adjusted under 35 U.S.C. 154(b) by 0 days.

(21) Appl. No.: 15/338,548

(22) Filed: Oct. 31, 2016

(30) Foreign Application Priority Data

Jul. 12, 2016 (CN) .......................... 2016 1 0544263

(51) Int. Cl.
*H01L 23/498* (2006.01)
*H01L 21/48* (2006.01)
*H01L 23/00* (2006.01)

(52) U.S. Cl.
CPC ...... *H01L 23/49838* (2013.01); *H01L 21/486* (2013.01); *H01L 21/4853* (2013.01); *H01L 21/4857* (2013.01); *H01L 23/49816* (2013.01); *H01L 23/49822* (2013.01); *H01L 23/49827* (2013.01); *H01L 23/49866* (2013.01); *H01L 23/49894* (2013.01); *H01L 24/81* (2013.01); *H01L 2224/81192* (2013.01)

(58) Field of Classification Search
CPC ......... H01L 23/49838; H01L 23/49866; H01L 21/4857; H01L 24/81; H01L 23/49822; H01L 21/4853; H01L 23/49894; H01L 23/49827; H01L 21/486; H01L 23/49816
See application file for complete search history.

(56) References Cited

U.S. PATENT DOCUMENTS 9,334,576 B2 *   5/2016   Miyazawa ............... C25D 7/00

* cited by examiner

*Primary Examiner* — William Coleman
(74) *Attorney, Agent, or Firm* — Steven Reiss

(57) ABSTRACT

A package substrate includes a first conductive wire layer having a first end portion and a second end portion opposite to the first end portion. A width of the first end portion is greater than that of the second end portion. An isolating layer covers the second end portion and contains the first conductive wire layer. The isolating layer defines blind holes which have conductive portions. A second conductive wire layer covers the isolating layer, and includes a third end portion facing the second end portion and a fourth end portion opposite to the third end portion. A width of the third end portion is greater than that of the fourth end portion. Solder mask layers are formed on the first conductive wire layer and on the second conductive wire layer, each solder mask layer defining an opening.

19 Claims, 5 Drawing Sheets

PACKAGE SUBSTRATE, METHOD FOR MAKING THE SAME, AND PACKAGE STRUCTURE HAVING THE SAME

FIELD

The subject matter herein generally relates to a package substrate, a method for making the package substrate, and a package structure having the package substrate.

BACKGROUND

Package substrates are printed substrates used to support electronic components (such as semiconductor chips). A package substrate includes conductive wire layers which may be formed by an electroplating process. However, the electroplating process may be costly. Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
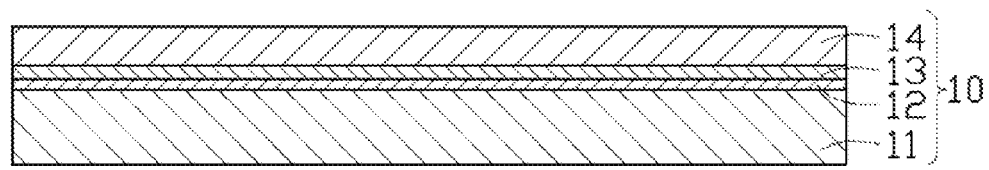
FIG. 1 is a diagrammatic view of an exemplary embodiment of a substrate used in a package substrate according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Referring to FIGS. 1-12, a method for making a package substrate (package substrate 100) is presented in accordance with an exemplary embodiment. The method for making the package substrate 100 is provided by way of example, as there are a variety of ways to carry out the method. The exemplary method can begin at step 1.

At step 1, referring to FIG. 1, a substrate 10 is provided which comprises an isolated supporting plate 11, a resistant layer 13 connected to at least one surface of the supporting plate 11, and a first copper layer 14 connected to each resistant layer 13. The resistant layer 13 may be an etch-resistant layer which can prevent the supporting plate 11 from being etched.

In at least one exemplary embodiment, the resistant layer 13 is made of nickel, and has a thickness of about 0.5 μm to about 1 μm. The first copper layer 14 has a thickness of about 18 μm. The supporting plate 11 is made of resin. The resin can be selected from a group consisting of polyimide, polyethylene terephthalate, polyethylene naphthalate, and any combination thereof. The substrate 10 can further comprise a third copper layer 12 positioned between the supporting plate 11 and each resistant layer 13. The third copper layer 12 has a thickness of about 3 μm to about 5 μm.

Figure 2:
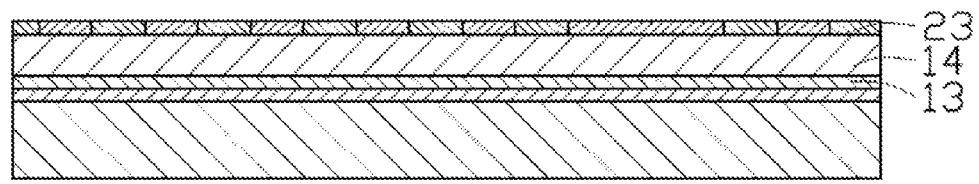
FIG. 2 is a diagrammatic view showing a dry film covering the substrate of FIG. 1.
Figure 3:
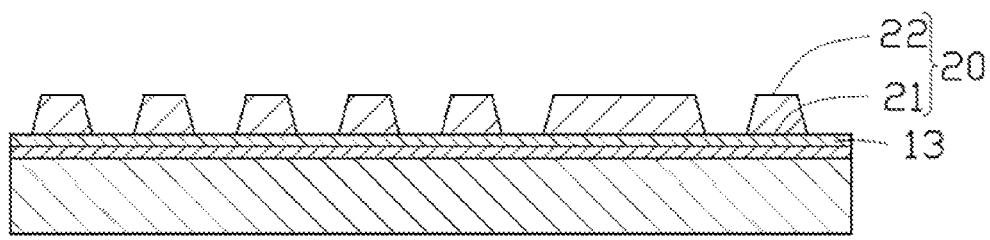
FIG. 3 is a diagrammatic view showing the substrate being etched by the dry film of FIG. 2 to form a first conductive wire layer.

At step 2, referring to FIGS. 2 and 3, each first copper layer 14 is etched by a hybrid etching process to form a first conductive wire layer 20. The first conductive wire layer 20 has a first end portion 21 adjacent to the resistant layer 13 and a second end portion 22 opposite to the first end portion 21. A width of the first end portion 21 is greater than that of the second end portion 22, that is, a cross-section of the first conductive layer 20 is trapezoidal.

In at least one exemplary embodiment, since the first conductive wire layer 20 is formed by the hybrid etching process, a difference between the widths of the first end portion 21 and the second end portion 22 is less than 10 μm.

In at least one embodiment, each first copper layer 14 is covered by a dry film 23 (see FIG. 2). The first copper layer 14 is etched by the dry film 23 through the hybrid etching process to form the first conductive wire layer 20, and then the dry film 23 is removed (see FIG. 3).

In at least one exemplary embodiment, the dry film 23 is a photosensitive dry film which can be transferred to a pattern dry film after an exposure and development process. The pattern dry film can then function as a photomask when the first copper layer 14 is etched.

Figure 4:
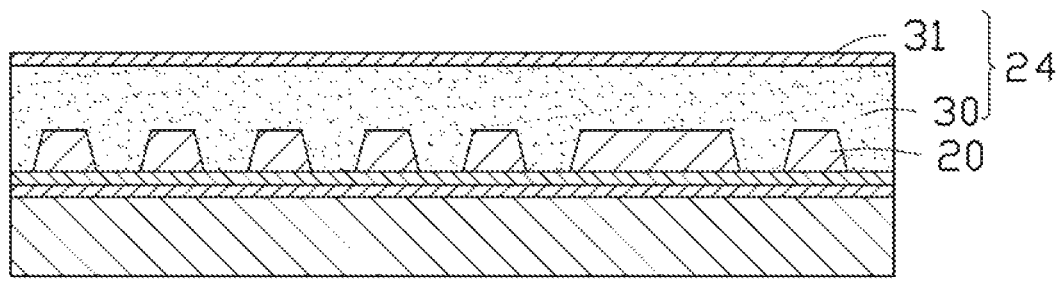
FIG. 4 is a diagrammatic view showing a copper substrate covering the first conductive wire layer of FIG. 3.

At step 3, referring to FIG. 4, a copper substrate 24 comprising an isolating layer 30 and a second copper layer 31 is applied on each first conductive wire layer 20, the isolating layer 30 fills in the gaps formed by the first conductive wire layer 20, thereby embedding the first conductive wire layer 20 within the isolating layer 30.

In at least one exemplary embodiment, the isolating layer 30 is semi-solidified allowing it to flow when pressed and fill in gaps formed by the first conductive wire layer 20.

Figure 5:
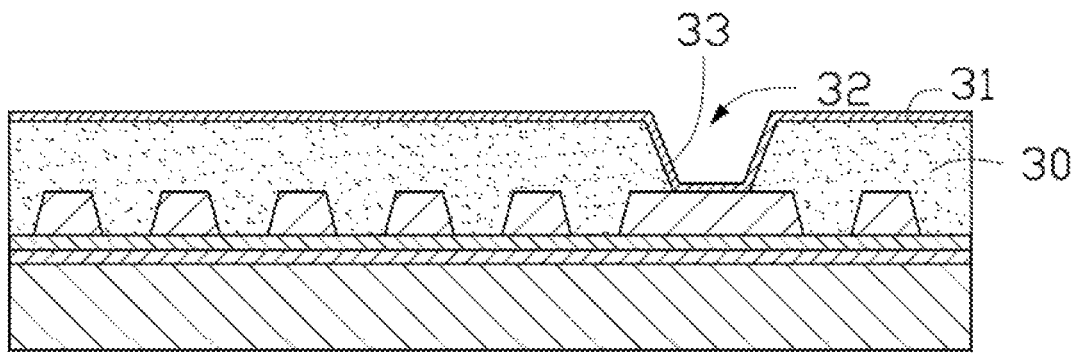
FIG. 5 is a diagrammatic view showing a second copper layer of the copper substrate of FIG. 4 being thinned and blind holes being defined.

At step 4, referring to FIG. 5, each second copper layer 31 is thinned by a half etching process. A number of blind holes 32 are defined in the thinned second copper layer 31 to expose the first conductive layer 20.

In at least one exemplary embodiment, the blind holes 32 are defined by a laser process.

In at least one exemplary embodiment, inner walls of the blind holes 32 further comprise conductive layers 33 formed by chemical plating.

Figure 6:
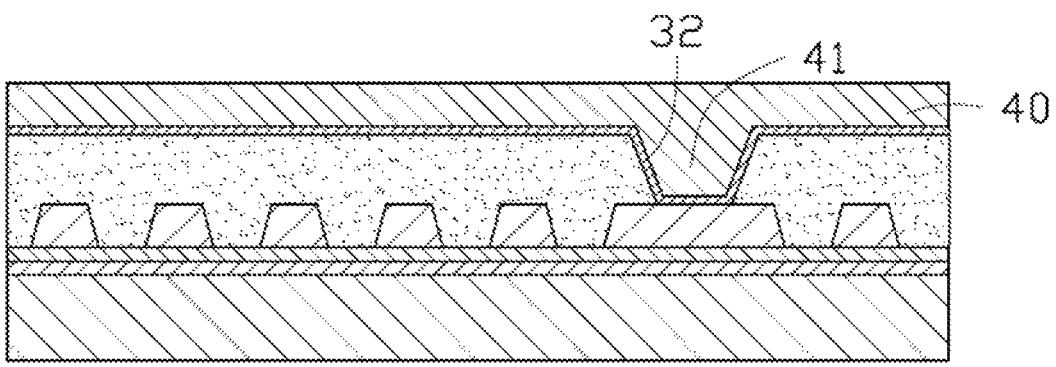
FIG. 6 is a diagrammatic view showing a copper plating layer being formed on the thinned second copper layer of FIG. 5.

At step 5, referring to FIG. 6, a copper plating layer 40 is formed on each thinned second copper layer 31. The copper plating layer 40 is applied within the blind holes 32 to form conductive portions 41.

Figure 7:
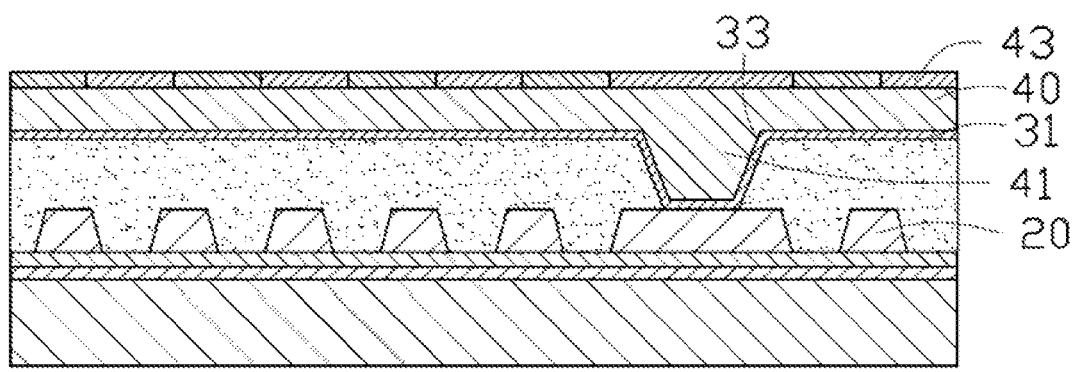
FIG. 7 is a diagrammatic view showing a dry film covering the copper plating layer of FIG. 6.
Figure 8:
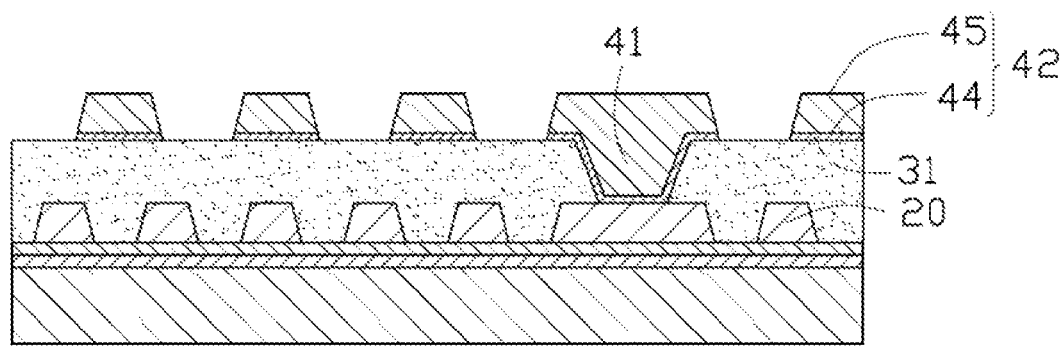
FIG. 8 is a diagrammatic view showing the copper plating layer of FIG. 7 being etched by the dry film to form a second conductive wire layer.

At step 6, referring to FIGS. 7 and 8, each copper plating layer 40 and a portion of the second copper layer 31 positioned under the copper plating layer 40 are etched by a hybrid etching process to form a second conductive wire layer 42. The second conductive wire layer 42 has a third end portion 44 facing the second end portion 22 and a fourth end portion 45 opposite to the third end portion 44. A width of the third end portion 44 is greater than that of the fourth end portion 45, that is, a cross-section of the second conductive wire layer 42 is trapezoidal. The second conductive wire layer 42 is electrically connected to the first conductive wire layer 20 by the conductive portions 41.

In at least one exemplary embodiment, since the second conductive wire layer 42 is formed by the hybrid etching process, a difference between the widths of the third end portion 44 and the fourth end portion 45 is less than 10 μm.

In at least one exemplary embodiment, a line width and a line space of the second conductive wire layer 42 are greater than or equal to those of the first conductive wire layer 20.

In at least one exemplary embodiment, each copper plating layer 40 is covered by a dry film 43 (see FIG. 7). The copper plating layer 40 and the portion of the second copper layer 31 positioned under the copper plating layer 40 are etched around the dry film 43 by the hybrid etching process to form the second conductive wire layer 42. The dry film 43 is then removed (see FIG. 8).

In at least one exemplary embodiment, the dry film 43 is a photosensitive dry film which can be transferred to a pattern dry film after an exposure and development process. The pattern dry film can then function as a photomask when the copper plating layer 40 and the portion of the second copper layer 31 positioned under the copper plating layer 40 are etched.

Figure 9:
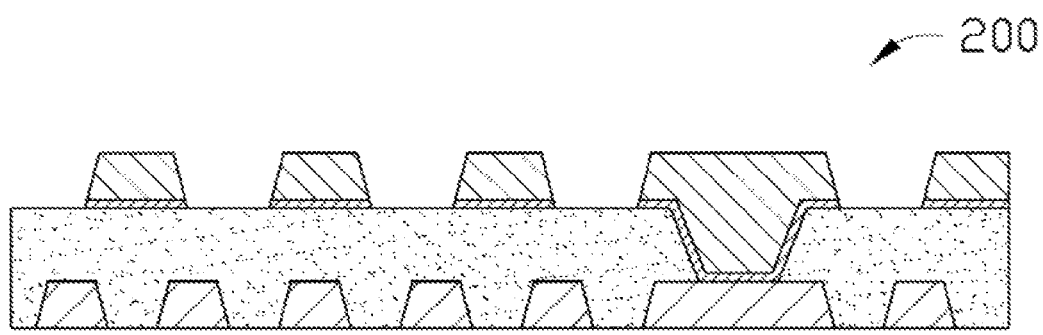
FIG. 9 is a diagrammatic view showing a resistant layer and a supporting plate of the substrate of FIG. 8 being removed to obtain an intermediate product.

At step 7, referring to FIG. 9, each resistant layer 13 and the supporting plate 11 are removed to obtain at least one intermediate product 200.

Figure 10:
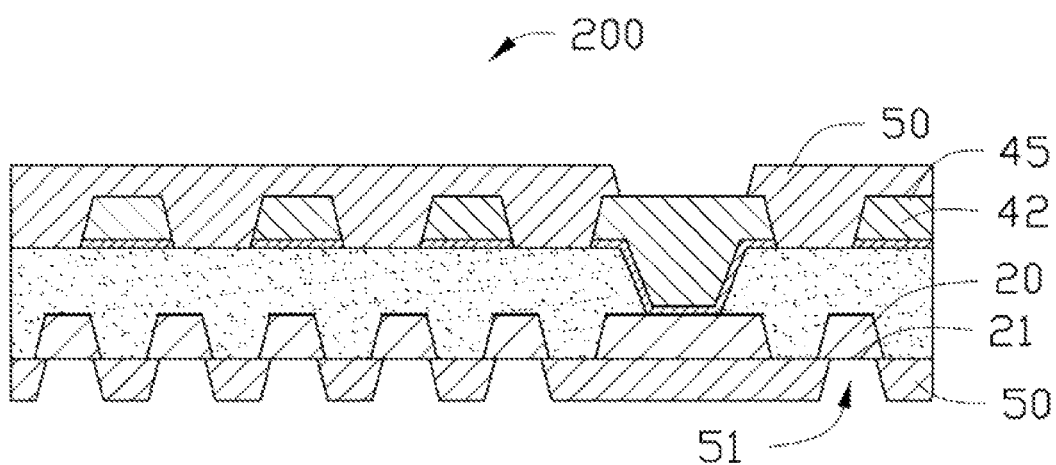
FIG. 10 is a diagrammatic view of the package substrate after formation of two solder mask layers on the intermediate product of FIG. 9.

At step 8, referring to FIG. 10, two solder mask layers 50 are formed on the first conductive wire layer 20 and on the second conductive wire layer 42 of each intermediate product 200. A number of openings 51 are defined in each solder mask layer 50 to expose the first end portion 21 and the fourth end portion 45, thereby forming the package substrate 100.

In at least one exemplary embodiment, the solder mask layers 50 are formed by a coating process. Before the solder mask layers 50 are formed, each solder mask layer 50 is covered by a dry film (not shown). The dry film functions as a photomask when the solder mask layer 50 is etched to form the openings 51 by an exposure and development process. The dry film is then removed.

In at least one exemplary embodiment, a portion of the second conductive wire layer 42 which is not covered by the solder mask layer 50 (that is, the openings 51 positioned at the fourth end portion 45) can function as a ball pad. Such a ball pad can be connected to a peripheral device (not shown). A portion of the first conductive wire layer 20 not covered by the solder mask layer 50 (that is, the openings 51 positioned at the first end portion 21) can function as a bump pad. Such a bump pad can be connected to a semiconductor chip 61 (shown in FIG. 12). Since the width of the first end portion 21 is greater than that of the second end portion 22, a tolerance can be increased when forming the solder mask layer 50 by coating, thereby allowing the package substrate 100 with a smaller line width to be formed.

Figure 11:
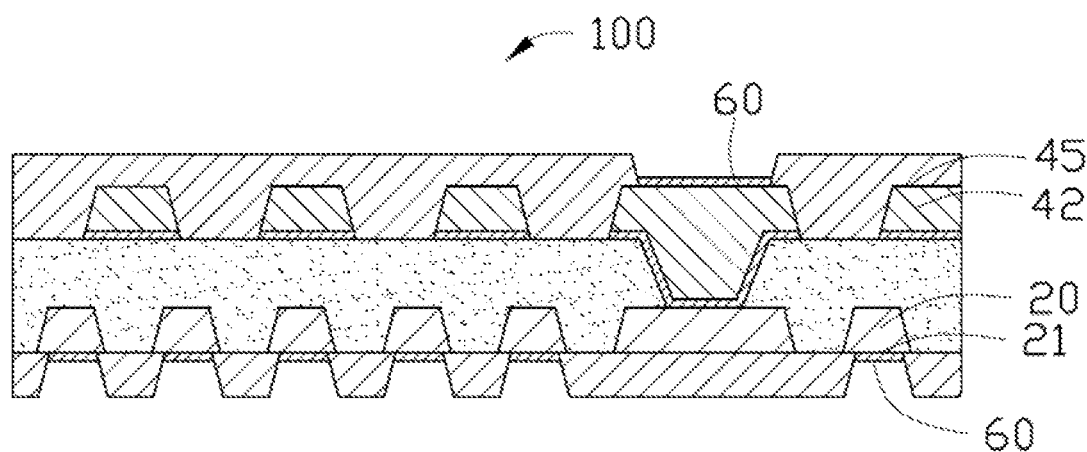
FIG. 11 is a diagrammatic view showing a surface treatment layer formed on the package substrate of FIG. 10.
Figure 12:
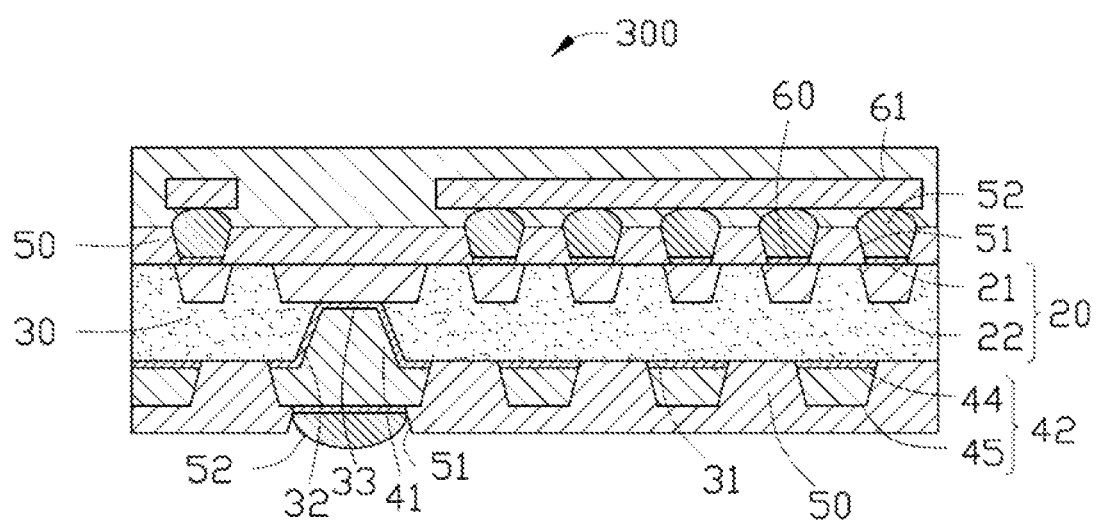
FIG. 12 is a diagrammatic view showing solder balls and a semiconductor chip connected to the package substrate of FIG. 11 to form a package structure.

Referring to FIGS. 11 and 12, after the package substrate 100 is formed, a surface treatment layer 60 is formed on a bottom of each opening 51 (see FIG. 11). Solder balls 52 are then formed in the openings 51 which are connected to the first end portion 21 and the fourth end portion 45. A semiconductor chip 61 is electrically connected to the solder balls 52 positioned at the first end portion 21, thereby forming a package structure 300 (see FIG. 12).

In at least one exemplary embodiment, the surface treatment layer 60 is made of gold-nickel alloy.

Thus, the above method for making the package substrate 100 reduces manufacturing costs.

Referring to FIGS. 11 and 12, the package substrate 100 comprises the first conductive wire layer 20 and the isolating layer 30. The first conductive wire layer 20 comprises the first end portion 21 and a second end portion 22 opposite to the first end portion 21. The width of the first end portion 21 is greater than that of the second end portion 22. The isolating layer 30 covers the second end portion 22 and fills the gaps formed by the first conductive wire layer 20, thereby embedding the first conductive wire layer 20 within the isolating layer 30. The isolating layer 30 defines the blind holes 32 to expose the first conductive layer 20. The conductive portions 41 are formed in the blind holes 32. The second conductive wire layer 42 is covered on the isolating layer 30. The second copper layer 31 is sandwiched between the second conductive wire layer 42 and the portion of the isolating layer 30 covered by the second conductive wire layer 42. The second conductive wire layer 42 is electrically connected to the first conductive wire layer 20 by the conductive portions 41. The second conductive wire layer 42 comprises the third end portion 44 facing the second end portion 22 and a fourth end portion 45 opposite to the third end portion 44. The width of the third end portion 44 is greater than that of the fourth end portion 45. The two solder mask layers 50 are formed on the first conductive wire layer 20 and the second conductive wire layer 42. Each solder mask layer 50 defines the openings 51 to expose the first end portion 21 and the fourth end portion 45.

In at least one exemplary embodiment, a bottom of each opening 51 comprises the surface treatment layer 60.

In at least one exemplary embodiment, the difference between the widths of the first end portion 21 and the second end portion 22 is less than 10 μm. The difference between the widths of the third end portion 44 and of the fourth end portion 45 is less than 10 μm.

In at least one exemplary embodiment, the inner walls of the blind holes 32 further comprise conductive layers 33.

Referring to FIG. 12, the package structure 300 comprises the package substrate 100. The package structure 300 further comprises the solder balls 52 formed in the openings 51 which are connected to the first end portion 21 and the fourth end portion 45. The semiconductor chip 61 is electrically connected to the solder balls 52 positioned at the first end portion 21.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for making a package substrate comprising:
   providing a substrate comprising of a supporting plate, a resistant layer connected to at least one surface of the supporting plate, and a first copper layer connected to each resistant layer;
   etching each first copper layer by a hybrid etching process to form a first conductive wire layer having a first end portion adjacent to the resistant layer and a second end portion opposite to the first end portion, a width of the first end portion being greater than that of the second end portion;
   covering each first conductive wire layer with a copper substrate comprising an isolating layer and a second copper layer, the isolating layer filling in gaps formed by the first conductive wire layer, thereby embedding the first conductive wire layer within the isolating layer;
   thinning each second copper layer by a half etching process, and defining a plurality of blind holes in the thinned second copper layer to expose the first conductive layer;
   forming a copper plating layer on each thinned second copper layer, the copper plating layer being filled in the plurality of blind holes to form conductive portions;
   etching each copper plating layer and a portion of the second copper layer positioned under the copper plating layer by a hybrid etching process to form a second conductive wire layer having a third end portion facing the second end portion and a fourth end portion opposite to the third end portion, a width of the third end portion being greater than that of the fourth end portion, the second conductive wire layer being electrically connected to the first conductive wire layer by the conductive portions;
   removing each resistance layer and the supporting plate; and
   forming two solder mask layers on the first conductive wire layer and the second conductive wire layer, and defining a plurality of openings in each solder mask layer to expose the first end portion and the fourth end portion, thereby forming the package substrate.

2. The method of claim 1, wherein the resistant layer is made of nickel, and has a thickness of about 0.5 μm to about 1 μm.

3. The method of claim 1, wherein the first copper layer has a thickness of about 18 μm.

4. The method of claim 1, wherein the supporting plate is made of resin selected from a group consisting of polyimide, polyethylene terephthalate, polyethylene naphthalate, or any combination thereof.

5. The method of claim 1, wherein the substrate further comprises a third copper layer positioned between the supporting plate and each resistant layer; the third copper layer has a thickness of about 3 μm to about 5 μm.

6. The method of claim 1, wherein a difference between the widths of the first end portion and the second end portion is less than 10 μm.

7. The method of claim 1, wherein the plurality of blind holes is defined by a laser process.

8. The method of claim 1, wherein inner walls of the blind holes further comprise conductive layers which are formed by chemical plating.

9. The method of claim 1, wherein a difference between the widths of the third end portion and the fourth end portion is less than 10 μm.

10. The method of claim 1, wherein a line width and a line space of the second conductive wire layer are greater than or equal to those of the first conductive wire layer.

11. The method of claim 1, wherein the solder mask layers are formed by coating.

12. The method of claim 1 further comprising:
    forming solder balls in the plurality of openings which are connected to the first end portion and the fourth end portion; and
    electrically connecting a semiconductor chip to the solder balls positioned at the first end portion, thereby forming a package structure.

13. The method of claim 1, wherein a surface treatment layer is formed on a bottom of each of the plurality of openings.

14. A package substrate comprising:
    a first conductive wire layer comprising a first end portion and a second end portion opposite to the first end portion, a width of the first end portion being greater than that of the second end portion;
    an isolating layer covering the second end portion and filling gaps formed by the first conductive wire layer, thereby embedding the first conductive wire layer within the isolating layer, the isolating layer defining a plurality of blind holes to expose the first conductive layer;
    a plurality of conductive portions formed in the plurality of blind holes;
    a second conductive wire layer covered on the isolating layer and electrically connected to the first conductive wire layer by the conductive portions, the second conductive wire layer comprising a third end portion facing the second end portion and a fourth end portion opposite to the third end portion, a width of the third end portion being greater than that of the fourth end portion;
    a second copper layer sandwiched between the second conductive wire layer and a portion of the isolating layer covered by the second conductive wire layer; and
    the two solder mask layers formed on the first conductive wire layer and the second conductive wire layer, each solder mask layer defining a plurality of openings to expose the first end portion and the fourth end portion.

15. The package substrate of claim 14, wherein a bottom of each of the plurality of opening comprises a surface treatment layer.

16. The package substrate of claim 14, wherein a difference between the widths of the first end portion and the second end portion is less than 10 μm.

17. The package substrate of claim 14, wherein a difference between the widths of the third end portion and the fourth end portion is less than 10 μm.

18. The package substrate of claim 14, wherein inner walls of the plurality of blind holes further comprise conductive layers.

19. A package substrate comprising:
    a first conductive wire layer comprising a first end portion and a second end portion opposite to the first end portion, a width of the first end portion being greater than that of the second end portion;

an isolating layer covering the second end portion and filling gaps formed by the first conductive wire layer, thereby embedding the first conductive wire layer within the isolating layer, the isolating layer defining a plurality of blind holes to expose the first conductive layer;

a plurality of conductive portions formed in the plurality of blind holes;

a second conductive wire layer covered on the isolating layer and electrically connected to the first conductive wire layer by the conductive portions, the second conductive wire layer comprising a third end portion facing the second end portion and a fourth end portion opposite to the third end portion, a width of the third end portion being greater than that of the fourth end portion;

a second copper layer positioned between the second conductive wire layer and a portion of the isolating layer covered by the second conductive wire layer;

the two solder mask layer formed on the first conductive wire layer and the second conductive wire layer, each solder mask layer defining a plurality of openings to expose the first end portion and the fourth end portion;

a plurality of solder balls formed in the plurality of openings which are connected to the first end portion and the fourth end portion, and a semiconductor chip electrically connected to the plurality of solder balls positioned at the first end portion.

* * * * *